US008093968B2

(12) United States Patent
Naito

(10) Patent No.: US 8,093,968 B2
(45) Date of Patent: Jan. 10, 2012

(54) MICROELECTROMECHANICAL ELEMENT AND ELECTROMECHANICAL SWITCH USING THE SAME

(75) Inventor: Yasuyuki Naito, Osaka (JP)

(73) Assignee: Panasonic Corporation, Osaka (JP)

( * ) Notice: Subject to any disclaimer, the term of this patent is extended or adjusted under 35 U.S.C. 154(b) by 29 days.

(21) Appl. No.: 11/814,187

(22) PCT Filed: Oct. 11, 2006

(86) PCT No.: PCT/JP2006/320342
§ 371 (c)(1),
(2), (4) Date: Jul. 18, 2007

(87) PCT Pub. No.: WO2007/060793
PCT Pub. Date: May 31, 2007

(65) Prior Publication Data
US 2009/0200144 A1 Aug. 13, 2009

(30) Foreign Application Priority Data
Nov. 24, 2005 (JP) ................................. 2005-338922

(51) Int. Cl.
*H01H 51/22* (2006.01)
(52) U.S. Cl. .......................................... 335/78; 200/181
(58) Field of Classification Search .................... 335/78; 200/181
See application file for complete search history.

(56) References Cited

U.S. PATENT DOCUMENTS

| 6,287,885 B1 | 9/2001 | Muto et al. |
| 6,423,563 B2 | 7/2002 | Fukada et al. |
| 6,646,525 B2 * | 11/2003 | Bozler et al. .................. 333/246 |
| 6,667,245 B2 * | 12/2003 | Loo et al. ....................... 438/723 |
| 7,411,792 B2 * | 8/2008 | Richards et al. .............. 361/704 |
| 2005/0012975 A1 * | 1/2005 | George et al. ................. 359/223 |
| 2005/0077987 A1 * | 4/2005 | Forehand ....................... 335/78 |
| 2005/0083158 A1 * | 4/2005 | Ma ................................. 335/78 |
| 2006/0076634 A1 * | 4/2006 | Palmateer et al. ............ 257/415 |
| 2008/0017489 A1 * | 1/2008 | Kawakubo et al. ........... 200/181 |
| 2008/0264797 A1 * | 10/2008 | Pamula et al. ................ 204/600 |

FOREIGN PATENT DOCUMENTS

| DE | 10355038 | 10/2004 |
| JP | 2000-243977 A | 9/2000 |
| JP | 2002-057384 | 2/2002 |
| JP | 2004-253365 | 9/2004 |
| JP | 2005-209625 | 8/2005 |

OTHER PUBLICATIONS

Jeremy B. Muldavin et al.; "Inline Capacitive and DC-Contact MEMS Shunt Switches"; IEEE Microwave and Wireless Components Letters, vol. 11, No. 8 Aug. 2001.
"Effect of Capillary Condensation on Adhesion", 1985.

* cited by examiner

*Primary Examiner* — Bernard Rojas
(74) *Attorney, Agent, or Firm* — Pearne & Gordon LLP

(57) ABSTRACT

A microelectromechanical element of a hydrophobic surface structure with a long life and high reliability and an electromechanical switch using the microelectromechanical element are provided. The surface of an electrode has a composite surface structure of a first area made of a first material forming the electrode and a second area made of a second material at least having hydrophobicity. The surface structure is the composite surface structure of the electrode material and a monolayer, whereby physical compression of the monolayer is avoided. A structure wherein the monolayer is not formed on the propagation path of a radio frequency signal is adopted, so that an increase in an insertion loss and electric field damage are avoided.

22 Claims, 15 Drawing Sheets

MICROELECTROMECHANICAL ELEMENT AND ELECTROMECHANICAL SWITCH USING THE SAME

TECHNICAL FIELD

This invention relates to a microelectromechanical element and an electromechanical switch using it and in particular to improvement in the mechanical and electric durability of a hydrophobic surface structure having a monolayer.

BACKGROUND ART

While the widespread use of information communication machines such as a wireless terminal increases, the frequencies used for communications are increasingly put into a wider frequency band from several hundred MHz of a mobile telephone, etc., to a several GHz band of a wireless LAN, etc. Although terminals compatible with various communication systems are used independently at present, future implementation of a small-sized wireless terminal compatible with various communication systems is demanded. An increase in the number of passive parts such as switches incorporated in a cabinet of a terminal is foreseen; miniaturization of the passive parts is demanded.

Among them, research and development of radio frequency electromechanical (RF-MEMS: Radio Frequency MEMS) switches manufactured according to MEMS (Micro Electro Mechanical Systems) technology is actively conducted. The electromechanical switch is a switch for mechanically switching a signal propagation path by moving a minute moving electrode. The electromechanical switch has the advantages that it has excellent radio frequency characteristics of an ultra-low loss, high isolation, etc. Since the electromechanical switch can be manufactured in a process with a good affinity for RF-IC, it can also be incorporated in RF-IC and is expected as a technology largely contributing to miniaturization of a wireless section.

A switch described in patent document 1 is known as an electromechanical switch in a related art. It is a mechanical switch with membrane-like or rod-like moving electrodes made twin or cantilever and brought into or out of contact with electrode, thereby switching a signal propagation path. Electrostatic force is often used as the driving force source of a membrane or a moving body.

Means for realizing higher-speed response and lower drive voltage of the electromechanical switch is disclosed by the inventor of an art described in patent document 2. FIG. 14 is a perspective view to show the configuration of a high-speed response and low-voltage driven electromechanical switch. A comb-teeth electrode is provided on both sides of a moving electrode 103. FIG. 15 (a) is a sectional view taken on line A-A' in FIG. 14 and FIG. 15 (b) is a sectional view taken on line B-B' in FIG. 14. To drive the moving electrode 103 downward, a voltage is applied between the moving electrode 103 and a fixed electrode for driving the moving electrode 103. To drive the moving electrode 103 upward, a voltage is applied between the moving electrode 102 and the fixed comb-teeth electrode and an electrostatic force is added in a slanting upper direction. Since an electrostatic force can be applied in driving the moving electrode upward, the spring force can be lessened as compared with the case where the electrode is driven only by the spring force, and it is made possible to speed up at the ON/OFF time.

Thus, in the MEMS device with structures coming in mechanical contact with each other, a phenomenon in which a malfunction or a failure occurs due to attraction of a contact interface (stiction) introduces a problem. The possible stiction cause is attraction force interaction between contact surfaces caused by humidity, charging of an interlayer insulating film, etc.; among them, it is known that the attraction force caused by humidity is large.

FIG. 16 is a drawing to show the structure of a meniscus; (a) is a sectional view to show the case where the electrode surface is hydrophilic and (b) is a sectional view to show the case where the electrode surface is hydrophobic. As shown in FIG. 16, if the opposed electrodes come in contact with each other, a liquid drop (water, etc.) existing in an atmosphere condenses on the contact interface due to a capillary phenomenon and forms a liquid crosslinked structure (meniscus). Interelectrode distance $d_{cap}$ at which the meniscus can exist is described in non-patent document 2 and can be represented as in the following expression (1) using Kelvin radius $r_K$:

[Expression 1]

$$d_{cap}(RH) = -2R_k \cos\theta \qquad (1)$$
$$= -\frac{2\gamma_{la} v \cos\theta}{RT\ln(RH)}$$
$$= -\frac{(1.08 \text{ nm})\cos\theta}{\ln(RH)} (if Water)$$

θ is contact angle, $\gamma_{la}$ is surface energy of liquid and gas interface, v is mole volume, R is gas constant, T is temperature, and RH is relative humidity. If the interelectrode distance is away from $d_{cap}$, a meniscus is not formed. If the liquid is water, the value of $d_{cap}$ is 0.5 nm in RH 10% and 10 nm in RH 90% at the room temperature (27° C.).

As shown in FIG. 16 (a), if the electrode surface is hydrophilic, the contact angle θ of the meniscus with the solid surface becomes a value smaller than 90° and the curvature radius r of the curved structure of the meniscus surface becomes a positive value. In this case, Laplace pressure is dominant as the force acting between electrodes by the meniscus and can be represented as in the following expression (2) from non-patent document 2:

[Expression 2]

$$f_L = \Delta p A = \frac{\gamma_{la} A}{r} \qquad (2)$$

Δp is the pressure difference between the liquid and the gas, and A is the contact area between the meniscus and the solid surface. From expression (2), if the solid surface is hydrophilic and the curvature radius of the meniscus is positive, the Laplace pressure becomes a positive value and an attraction force acts between electrodes. The force causes stiction for attracting the moving body of an MEMS device. The force generated by the meniscus (capillary force) includes surface tension and Laplace pressure; the value of the Laplace pressure is larger and is dominant.

On the other hand, as shown in FIG. 16 (b), if the electrode surface is hydrophobic, the contact angle θ' of the meniscus with the solid surface becomes a value equal to or more than 90° and the curvature radius r of the curved structure of the meniscus surface becomes a negative value. In this case, from expression (2), the Laplace pressure becomes a negative value and a repulsion force acts between electrodes. If the electrode surface is made hydrophobic and a hydrophobic electrode structure with a repulsion force acting between electrodes can be realized, it is made possible to avoid occurrence of stiction in the MEMS device.

A hydrophobic surface can be provided by forming the electrode surface of a material with low surface energy. A self-assembled monolayer (SAM) is used as a low surface energy material; it can be formed according to a low-temperature and easy method of dipping, coating, etc., on the electrode surface.

FIG. 17 is a drawing to show the electrode face structure after a monolayer is formed in a related art shown in (patent document 1); (a) is a general view and (b) is a drawing to show the dotted line part in FIG. 17 (a). A monolayer 111 is formed on a fixed electrode 113 as shown in FIG. 17 (a). The monolayer has molecules arranged on the electrode surface as self-assembled and the layer thickness is the length of a single molecule. The monolayer surface has low surface energy and becomes a hydrophobic surface with the contact angle of a liquid drop 115 being 90° or more. If a moving electrode 114 comes in contact with such an electrode surface, the Laplace pressure becomes a repulsion force and acts in a direction in which the electrodes are brought away from each other.

A silane-based material such as ODS (Octadecyltri chlorosilane) is used as disclosed in (patent document 1), and the chemical structure becomes a straight chain molecular structure shown in FIG. 17 (b). In such a monolayer, —$CH_3$ group as the surface becomes low surface energy.

Patent document 1: DE-10355038-A1
Patent document 2: JP-A-2004-253365
Non-patent document 1: J. B. Muldavin and G. M. Rebeiz, IEEE Microwave Wireless Compon. Lett., vol. 11, pp. 334-336, August 2001.
Non-patent document 2: J. N. Israelachvili, "Intermolecular and surface forces," Academic Press Limited, 1985.

DISCLOSURE OF THE INVENTION

Problems to be Solved by the Invention

In the hydrophobic electrode structure in the related art, however, the surface material of the fixed electrode 113 is only the monolayer 111 and the pressure of the moving electrode 114 is applied directly to the monolayer 111 as shown in FIG. 17 (a) and therefore the mechanical strength of the monolayer 111 is degraded; this is a problem. As shown in FIG. 17 (b), paying attention to one molecule of the monolayer, the pressure of the moving electrode 114 is added to the monolayer 111, which then expands and contracts. If a force exceeding the elastic limit is added to the monolayer, the direct chain structure is destroyed as plastic deformation.

Further, to apply the hydrophobic electrode structure in the related art to a radio frequency device, since the monolayer is formed on the whole electrode surface, the monolayer is also formed on the propagation path of a radio frequency signal. In this case, the monolayer causes a dielectric loss to occur and the insertion loss of a radio frequency signal grows; this is a problem. Since the monolayer is exposed to the electric field generated by a radio frequency signal, if an electric field larger than the electric field strength corresponding to the dielectric, strength of the monolayer is added to the monolayer, electric damage to the monolayer occurs. Particularly in a radio frequency electromagnetic field, the monolayer continuously receives radio frequency electromagnetic field change and degradation of mechanical strength and degradation of hydrophobicity occur; this is a problem.

It is therefore an object of the invention to provide an electromechanical element having a hydrophobic surface structure with a long life and high reliability and an electromechanical switch using the electromechanical element.

Means for Solving the Problems

The invention is characterized in that a microelectromechanical element includes a first member and a second member for repeatedly coming in contact and noncontact with the first member, wherein a contact interface between the first member and the second member includes a first area where the first member and the second member directly contact, and a second area where a hydrophobic layer intervenes between the first member and the second member.

ADVANTAGES OF THE INVENTION

As described above, according to the invention, it is made possible to maintain the mechanical and electric durability of a monolayer and it is made possible to provide a long-life microelectromechanical element. It is also made possible to prevent occurrence of a dielectric loss and an increase in an insertion loss caused by the monolayer, and a hydrophobic electrode with a low loss can be provided. It is also made possible to avoid stiction in an MEMS device and it is made possible to realize a highly reliable electromechanical switch.

An electrode structure not affected by humidity can be provided and packaging at a high cost (application of a vacuum package, etc.) is not required, so that cost reduction of the MEMS device using low-cost packaging is possible.

DESCRIPTION OF REFERENCE NUMERALS

Figure 1A:
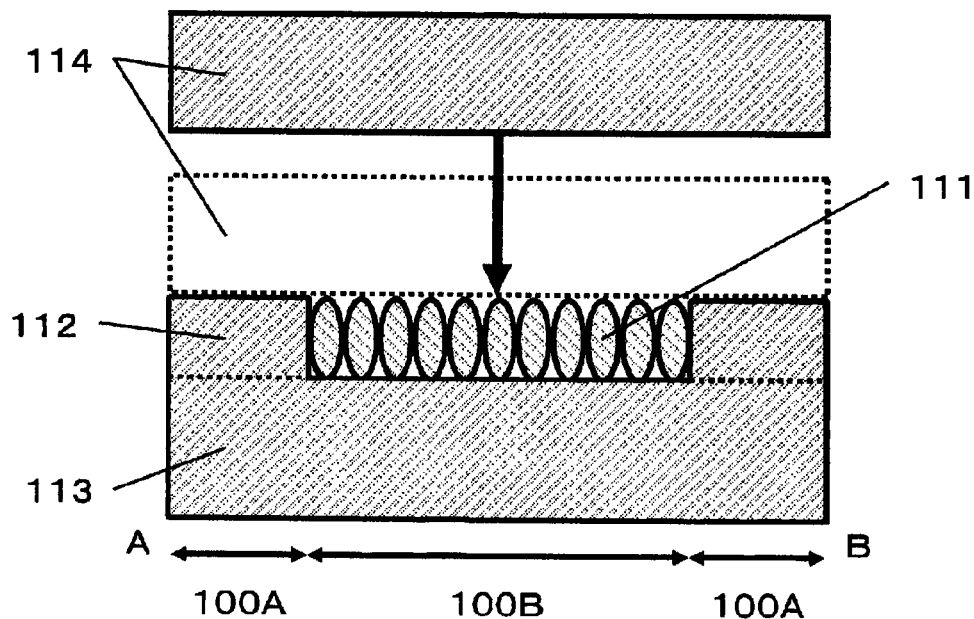
FIG. 1 is a drawing to show an electromechanical switch in a first embodiment of the invention; (a) is a sectional view to show the configuration of the electromechanical switch and (b) is a perspective view to show the configuration of the electromechanical switch.

111 Monolayer
112 Convex part (electrode material)
113 Fixed electrode
114, 103 Moving electrode
115 Droplet
116 Projection structure

BEST MODE FOR CARRYING OUT THE INVENTION

Embodiments of the invention will be discussed in detail with reference to the accompanying drawings.

First Embodiment

A first embodiment is a microelectromechanical switch includes a fixed electrode 113 as a first member and a moving electrode 114 as a second member for repeatedly coming in contact and noncontact with the first member, and the contact interface between the fixed electrode 113 and the moving electrode 114 contains a first area 100A where the fixed electrode 113 and the moving electrode 114 directly abut and a second area 100B where a hydrophobic layer intervenes between the fixed electrode 113 and the moving electrode 114. The surface structure of the fixed electrode 113 is a composite surface structure of an electrode material (first area 100A) and a hydrophobic monolayer (second area 100B) and the heights of the materials are made uniform, whereby physical compression of a hydrophobic monolayer 111 by the moving electrode 114 is avoided.

Figure 1B:
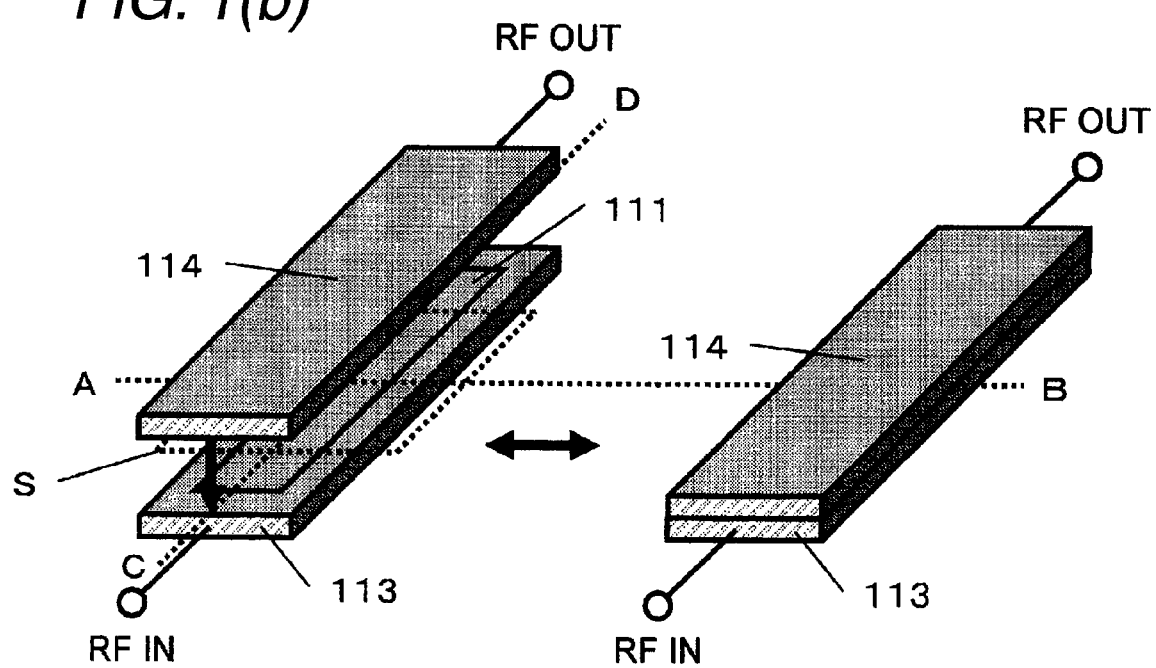

FIG. 1 is a drawing to show the main part of the electromechanical switch using the fixed electrode having the hydrophobic electrode structure in the first embodiment of the invention; (a) is a sectional view to show the configuration of the electromechanical switch of the hydrophobic electrode structure and (b) is a perspective view to show the configuration of the electromechanical switch of the hydrophobic electrode structure. Seeing the configuration as the electromechanical switch shown in FIG. 1 (*b*), an input port RF IN of a radio frequency signal is connected to the fixed electrode 113 and an output port RF OUT of a radio frequency signal is connected to the moving electrode 114. In the configuration, when the fixed electrode 113 and the moving electrode 114 are away from each other, a signal is shut out; when the electrodes come in contact with each other, a signal is allowed to pass through. The monolayer 111 is formed on the surface of the fixed electrode 113 to form a hydrophobic electrode for avoiding stiction. However, the monolayer 111 is formed only in the optimized area rather than the hydrophobic monolayer only formed as the surface material in the related art. The monolayer 111 uses a silane-based compound.

FIG. 1 (*a*) shows the section taken on line A-B in FIG. 1 (*b*). The fixed electrode 113 is formed on a surface with a convex part 112 formed of the same electrode material as the fixed electrode 113, and the monolayer 111 is formed in a concave part between the convex parts 112. That is, the convex part 112 forms the first area 100A for coming in direct contact with the surface of the moving electrode 114 and the concave part forms the second area 100B for coming in contact with the moving electrode through the monolayer 111. Thus, the structure wherein the monolayer 111 is formed in the concave part is adopted, so that if the moving electrode 114 physically comes in contact with the fixed electrode 113, the moving electrode 114 comes in contact with the convex part 112 and does not add physical compression to the monolayer.

Thus, if the moving electrode 114 physically comes in contact with the fixed electrode 113, the moving electrode 114 comes in contact with the convex part 112 formed of the same material as the fixed electrode and does not add physical compression to the monolayer, whereby degradation of the mechanical strength of the monolayer can be prevented and it is made possible to provide a highly reliable hydrophobic electrode structure.

To keep the mechanical strength and provide the repulsion force effect produced by hydrophobicity, the contact interface between the fixed electrode 113 and the moving electrode 114 needs to be a composite surface structure of the convex part 112 formed of the same electrode material as the fixed electrode 113 and the monolayer 111. To do this, it is desirable that the heights of the convex part 112 and the monolayer 111 should be made uniform over the whole surface. This means that the height of the convex structure of the electrode by the convex part 112 is about the length of the molecular chain forming the monolayer 111.

If the electromechanical switch is of resistance coupling type, the surface material of the fixed electrode 113 is an electrically conductive material of metal, etc., and if the electromechanical switch is of capacity coupling type, the surface material of the fixed electrode is an insulator (dielectric).

Such a hydrophobic electrode structure is adopted, whereby if the moving electrode 114 repeatedly comes in contact and noncontact with the fixed electrode 113 at high speed, mechanical breakage does not occur and electrical connection can also be maintained good.

Second Embodiment

Figure 2A:
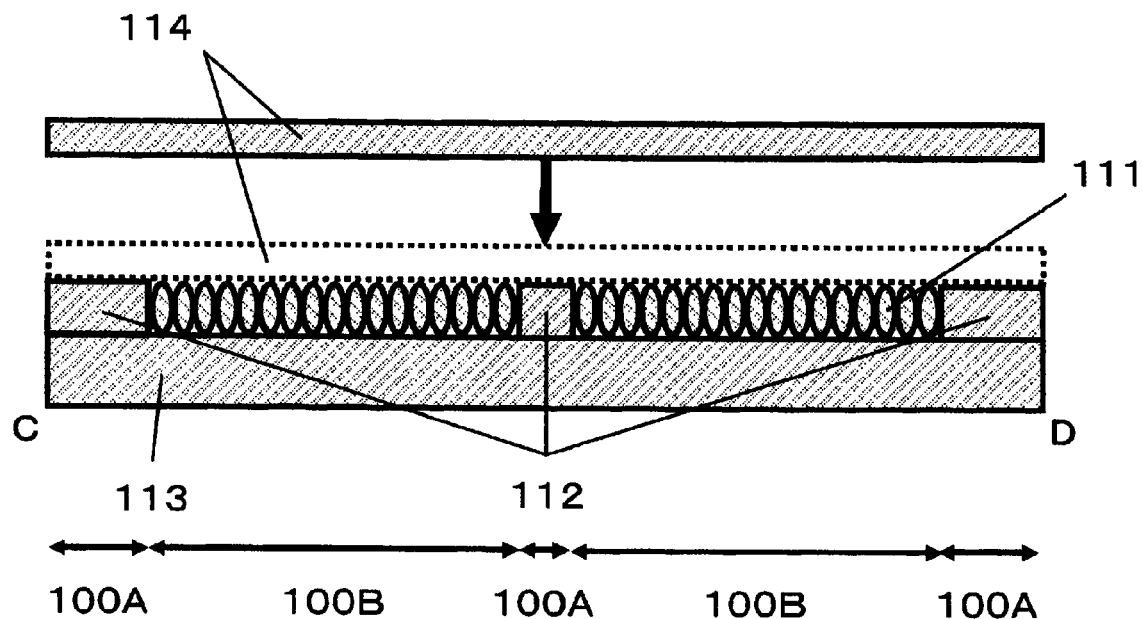
FIG. 2 is a drawing to show an electromechanical switch in a second embodiment of the invention; (a) is a sectional view to show the configuration of the electromechanical switch and (b) is a top view to show the configuration of the electromechanical switch.
Figure 2B:
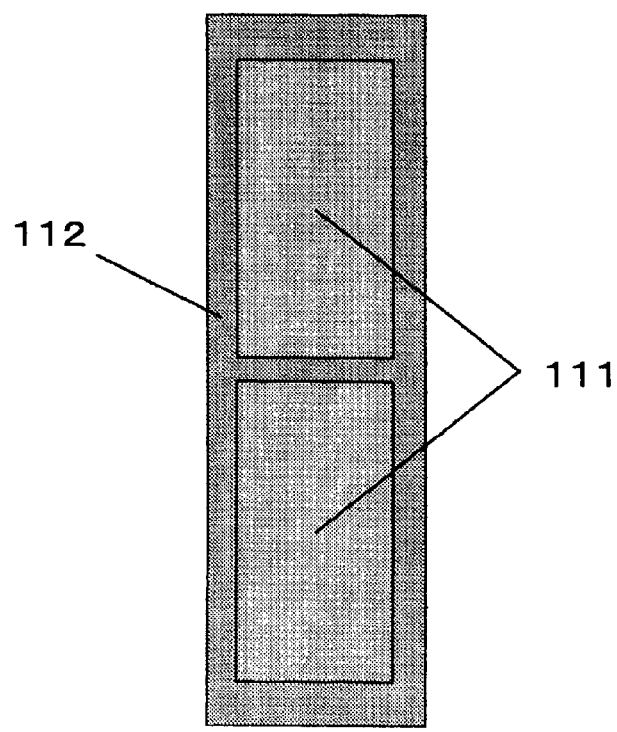

FIG. 2 is a drawing to show an electromechanical switch having a hydrophobic electrode structure in a second embodiment of the invention; (a) is a sectional view to show the configuration of the electromechanical switch having the hydrophobic electrode structure and (b) is a top view to show the hydrophobic electrode structure of a fixed electrode 113 of the electromechanical switch. After this, the top view means a top view relative to a parallel plane with an S plane shown in FIG. 1 (b). FIG. 2 (a) shows the section taken on line C-D in FIG. 1 (b). When a moving electrode 112 and the fixed electrode 113 come in contact with each other, the moving electrode 112 is cross linked as indicated by the dashed line between convex structures. If the spacing between the convex structures of an electrode material 112 on the fixed electrode 113 is long, there is a possibility that the moving electrode 112 may bend downward, compressing a monolayer 111 formed in a concave part.

To avoid this phenomenon, the number of the convex parts may be increased for shortening the spacing between the convex parts. As the number of the convex parts is increased, the length of the moving electrode 114 stretched between the convex parts is shortened and thus the spring force (restoring force) becomes large. The spacing between the convex parts may be set so as to provide a spring force at least to such an extent that the moving electrode does not bend on the drive voltage of the electromechanical switch. In FIG. 2, the convex parts 112 are formed of an electrode material so as to divide the concave part into two parts. Assuming that the moving electrode 114 is not in contact with the convex parts 112 in the width direction of the moving electrode, the length of the moving electrode 112 cross linked between the convex parts becomes about a half and therefore spring multiplier becomes eight times and pull-in voltage becomes 2.8 times. For example, assuming that the moving electrode 114 is length 500 μm, pull voltage 5 V, and drive voltage 10 V, after contact, the length becomes about 250 μm and the pull-in voltage becomes 14 V, and pulling in on the drive voltage 10 V is avoided at minimum.

Third Embodiment

Next, an electromechanical switch of a third embodiment of the invention will be discussed.

Figure 3A:
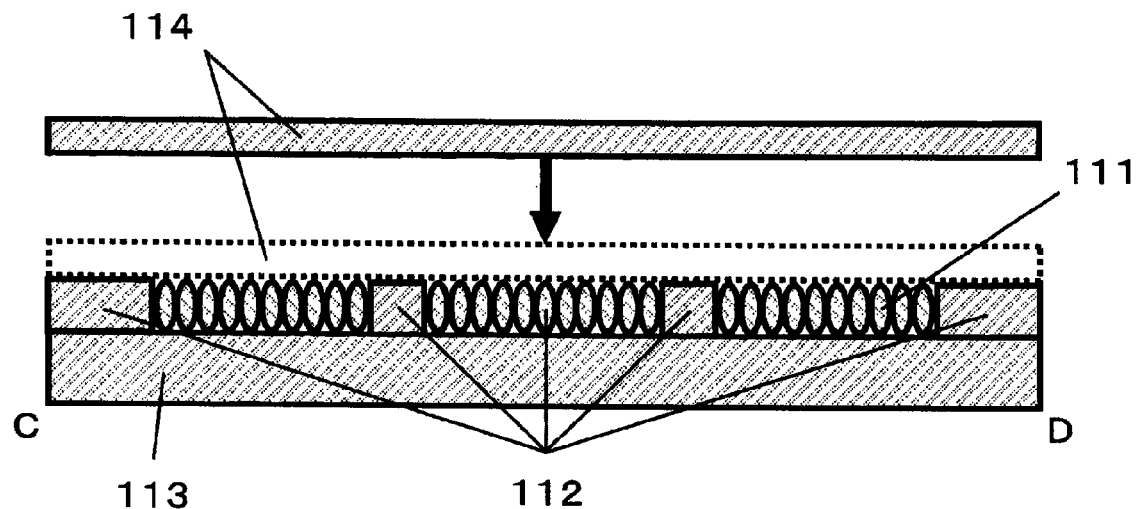
FIG. 3 is a drawing to show an electromechanical switch in a third embodiment of the invention; (a) is a sectional view to show the configuration of the electromechanical switch and (b) is a top view to show the configuration of the electromechanical switch.
Figure 3B:
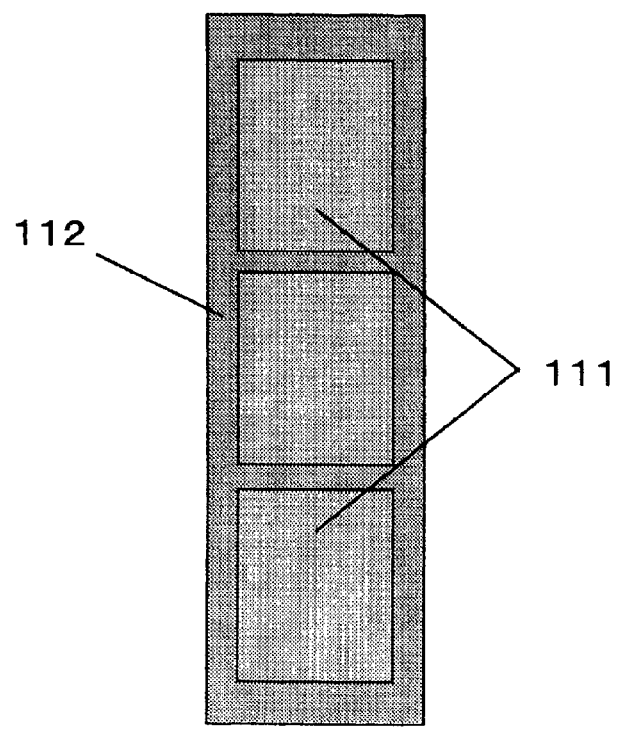

To optimize the spring force so as not to produce bend, the division form of a monolayer by convex parts 112 can be changed. FIG. 3 is a drawing to show an electromechanical switch of a hydrophobic electrode structure in the third embodiment of the invention; (a) is a sectional view to show the configuration of the electromechanical switch of the hydrophobic electrode structure and (b) is a top view to show a fixed electrode 113 of the hydrophobic electrode structure. In this case, a second area 100B where a monolayer 111 is formed is divided into three parts in the length direction by way of example.

According to the configuration, it is made possible to provide a longer-life and higher-reliability electromechanical switch.

Fourth Embodiment

Next, an electromechanical switch of a fourth embodiment of the invention will be discussed.

Figure 4A:
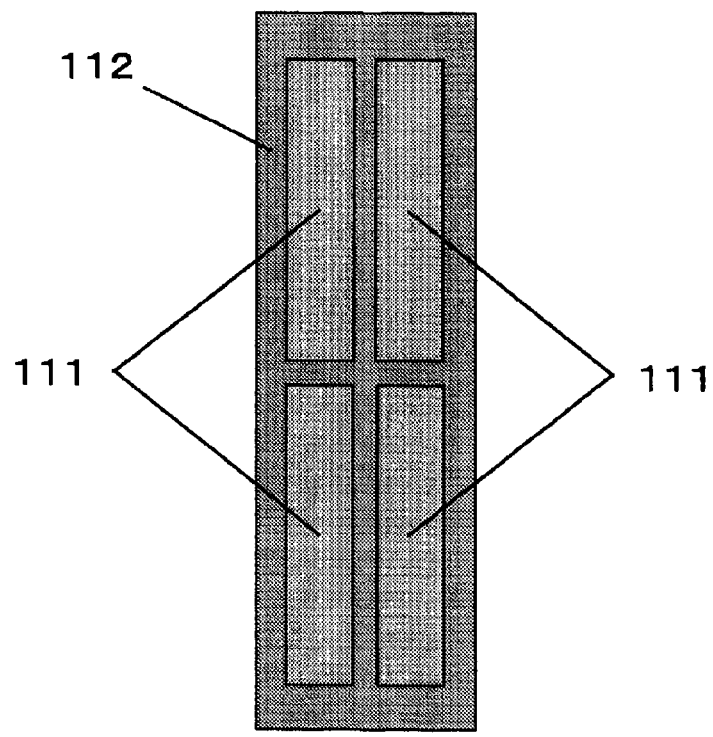
FIG. 4 is a drawing to show an electromechanical switch in a fourth embodiment of the invention; (a) is a top view to show the configuration of the electromechanical switch and (b) is a top view to show the configuration of the electromechanical switch.
Figure 4B:
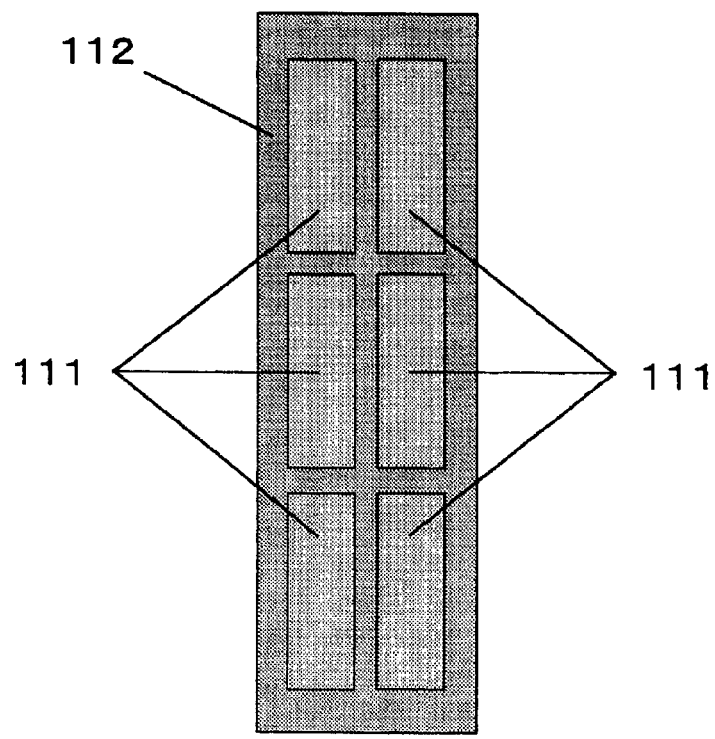

FIG. 4 is a drawing to show a modified example of the electromechanical switch of the hydrophobic electrode structure in the third embodiment of the invention; (a) is a top view to show one configuration of a fixed electrode of the electromechanical switch of the hydrophobic electrode structure and (b) is a top view to show another configuration of the fixed electrode of the fixed electrode surface of the hydrophobic electrode structure. In this case, an area is divided into two parts also in the width direction by way of example; (a) shows the case where the area is divided into two parts in the length direction and (b) shows the case where the area is divided into three parts in the length direction. The area is thus divided into two parts also in the width direction, whereby occurrence of bend of a moving electrode 114 in the width direction thereof can be avoided.

As described above, placement of convex parts 112 of electrode material on a fixed electrode 113 can be optimized. However, to avoid stiction, the area occupied by the convex parts 112 needs to be made small as much as possible. The area occupied by a monolayer 111 needs to be large as much as possible and the surface of low surface energy needs to be exclusive occupation.

Placement of the convex parts can be optimized so that the length of bend of the moving electrode 111 becomes shorter than the length of compression where plastic deformation of the monolayer occurs. That is, it is desirable that the placement spacing between the convex parts should be determined so that the upper limit of bend of the moving electrode 111 becomes to such an extent that plastic deformation does not occur in the monolayer occurs.

Fifth Embodiment

Next, a manufacturing method of a hydrophobic electrode will be discussed.

Figure 5A:
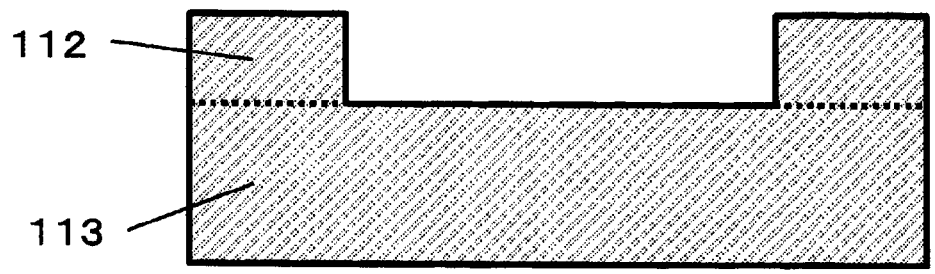
FIG. 5 is a cross-sectional schematic representation to stepwise describe a manufacturing process of an electromechanical switch in a fifth embodiment of the invention.
Figure 5B:
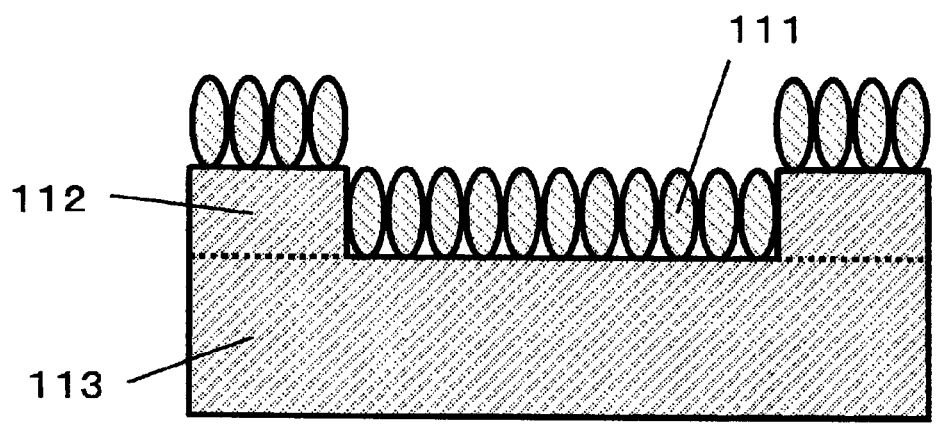
Figure 5C:
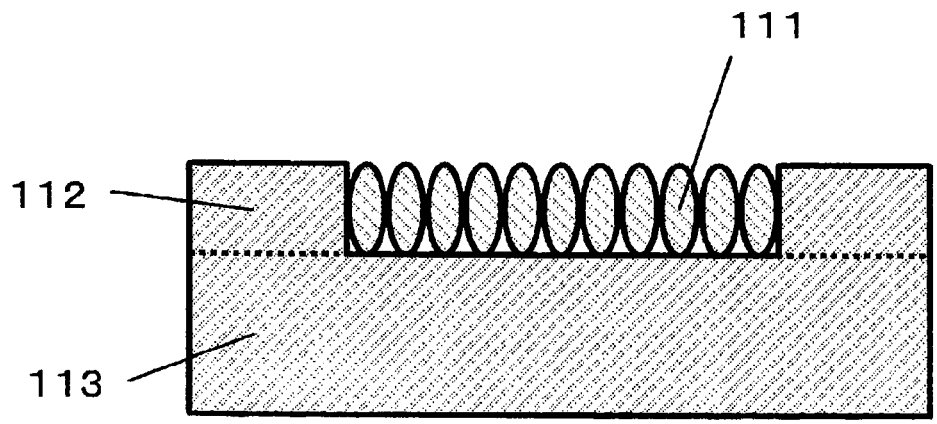

FIGS. 5 (a) to 5 (c) are cross-sectional schematic representations to stepwise describe a manufacturing process of an electromechanical switch having a hydrophobic electrode structure in a fifth embodiment of the invention. In the figures, only the surface of a fixed electrode 113 is shown. In the embodiment, a hydrophobic electrode structure wherein a silane-based compound is formed selectively as a monolayer is used.

First, a mask pattern (not shown) is formed on a fixed electrode 113 of a metal material of Al, W, etc., according to electron-beam lithography, photolithography, etc., and a concave part exposed from the mask pattern is formed by etching, whereby a convex structure having a convex part 112 made of an electrode material is formed. Then, the mask pattern is removed (FIG. 5 (a)).

Next, a monolayer 111 is formed according to a dipping method. In this case, it is formed on the full surface of the fixed electrode 113. Next, the monolayer 111 on the convex part 112 formed of electrode material is patterned by UV application for selective removal.

As the described steps are executed, it is made possible to form a hydrophobic electrode structure having a composite surface of the convex part 112 formed of electrode material and the monolayer 111 as shown in FIG. 5 (c).

The monolayer 111 is formed according to a self-assembled monolayer formation process. An alkoxy silane compound is added to water under agitation so that the final concentration becomes about 2% or less. Water hydrolyzes alkoxy silane to yield silanol, which reacts with —OH group on a substrate and condenses on the surface. Substitution is about five minutes. A specimen is dipped into a mixed solution and is slowly moved. Dipping is about three minutes. Then, cleaning is performed with ethanol. Cleaning is performed three times. After drying with $N_2$, etc., the specimen is heated with an oven and monolayer is fixed. Oven 100° C., 10 minutes. A silane-based compound can be applied to the self-assembled monolayer. As the silane-based compound, n-octadecyltriethoxysilane, etc., can be named.

After this, the monolayer of a convex part is selectively removed by UV application, whereby it is made possible to form the fixed electrode 113 having the monolayer 111 surrounded by the convex part 112 as shown in FIG. 5 (c)).

Figure 6A:
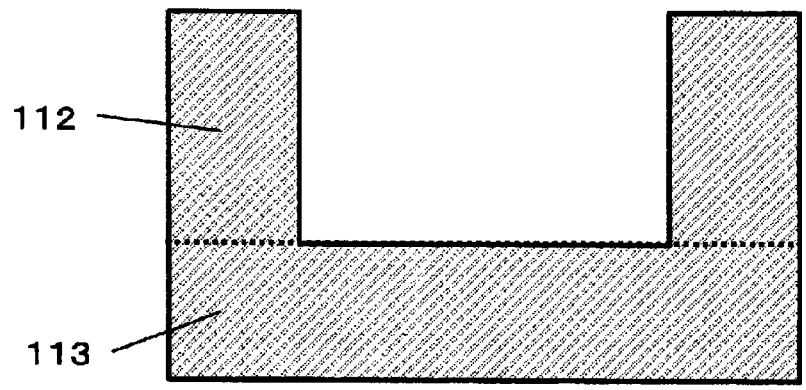
FIG. 6 is a cross-sectional schematic representation to stepwise describe a modified example of the manufacturing process of the electromechanical switch in the fifth embodiment of the invention.
Figure 6B:
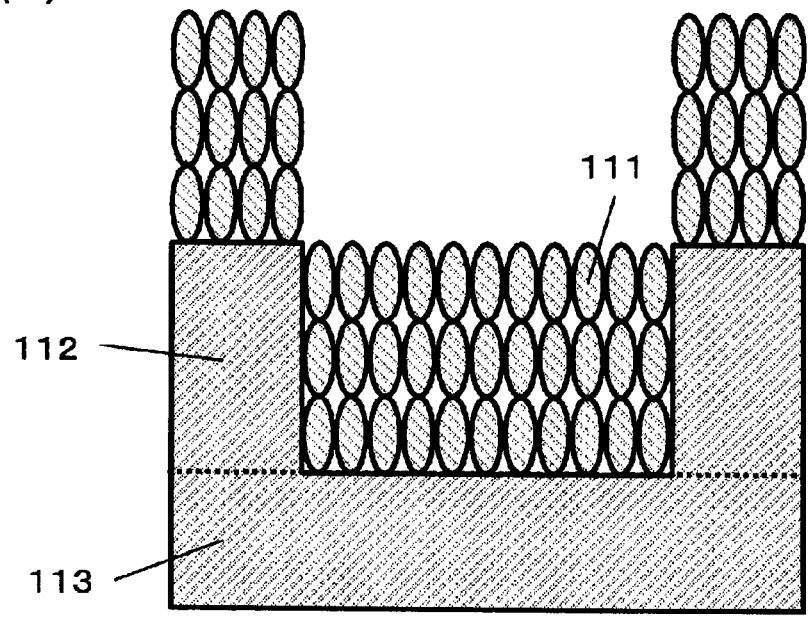
Figure 6C:
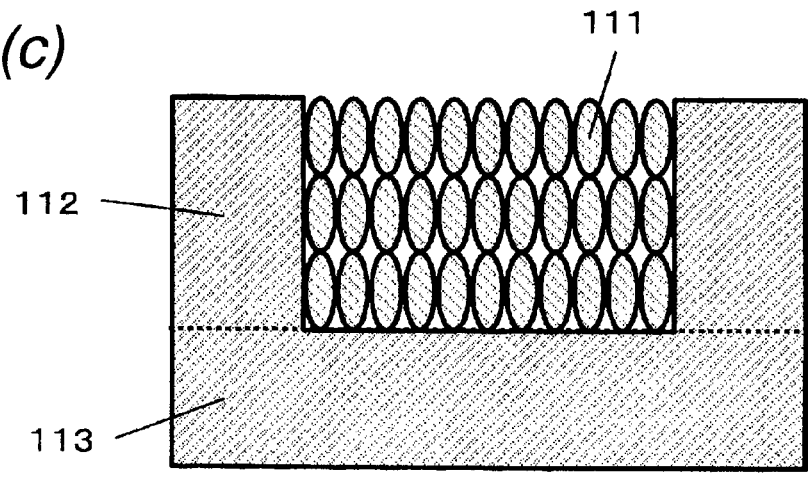

In the method of the embodiment shown in FIGS. 5 (a) to 5 (c), a silane-based compound layer as a monolayer is formed. As a modified example, as shown in FIGS. 6 (a) to 6 (c), to form the monolayer 111, multiple layers rather than a monolayer can also be stacked for controlling the film thickness in a step in FIG. 6 (b). Here, several molecular layers of silane-based compound molecular layers are formed. The film thickness can be appropriately adjusted by adjusting the film formation conditions of the substrate temperature, the gas pressure, etc.

The example is effective when the etching depth cannot sufficiently be controlled and the convex part height cannot be set to a desired value.

Thus, the method of using a film provided by stacking several molecules rather than a monolayer is adopted, whereby the thickness of the monolayer 111 can be adjusted in response to the height of the convex part 112 for providing a contact face structure wherein first and second regions are equal in height.

Metal of aluminum, gold, tungsten, etc., an insulator of aluminum oxide, silicon nitride, silicon oxide, Pb(Zr, Ti)O$_3$ (PZT), (Ba, Sr)TiO$_3$(BST), SrTiO$_3$(STO), HfO$_2$, AlN, etc., or a semiconductor of silicon, gallium arsenide, etc., is used as a member for forming a monolayer, and a silane-based compound is used as a monolayer, whereby it is made possible to strongly bond the member and the monolayer and a highly reliable hydrophobic surface structure can be provided.

In the electromechanical switch of the hydrophobic electrode structure in the first embodiment, the structures of the fixed electrodes 113 and the moving electrode 114 can be appropriately selected like a square, a circle, etc., and the switch can also be applied in a structure having no length direction.

If it is guaranteed that the monolayer 111 on the convex part 112 formed of electrode material is not adversely affected by adhesion, etc., as it comes in contact with the moving electrode 114, the removal step of the monolayer 111 shown in FIG. 5 (b) can be skipped. This means that the monolayer 111 is formed on both the concave part and the convex part in the completion state as shown in FIG. 5 (b).

The electromechanical switch having the hydrophobic electrode structure in the first embodiment can also be applied when the material of the fixed electrode and/or the moving electrode is a semiconductor material containing doped silicon or an insulator material.

In the embodiment described above, the monolayer is formed according to the dipping method, but a coating method, a Vapor-SAM method (CVD method) for forming a monolayer in a vapor phase, or the like may be used, needless to say.

Thus, according to the invention, a highly reliable hydrophobic electrode avoiding stiction can be realized. Using the process, an MEME device can also be realized.

Sixth Embodiment

Next, an electromechanical switch of a sixth embodiment of the invention will be discussed.

In the embodiment, a monolayer is formed in any other portion than the propagation portion of a radio frequency signal on a fixed electrode. A monolayer is formed in any other portion than the skin depth where a radio frequency signal propagates, whereby a monolayer is prevented from being formed on the propagation path of a radio frequency signal for avoiding occurrence of a dielectric loss and an increase in an insertion loss caused by the monolayer. Also, the monolayer is prevented from being exposed to the electric field produced by a radio frequency signal for avoiding electric damage to the monolayer.

Figure 7:
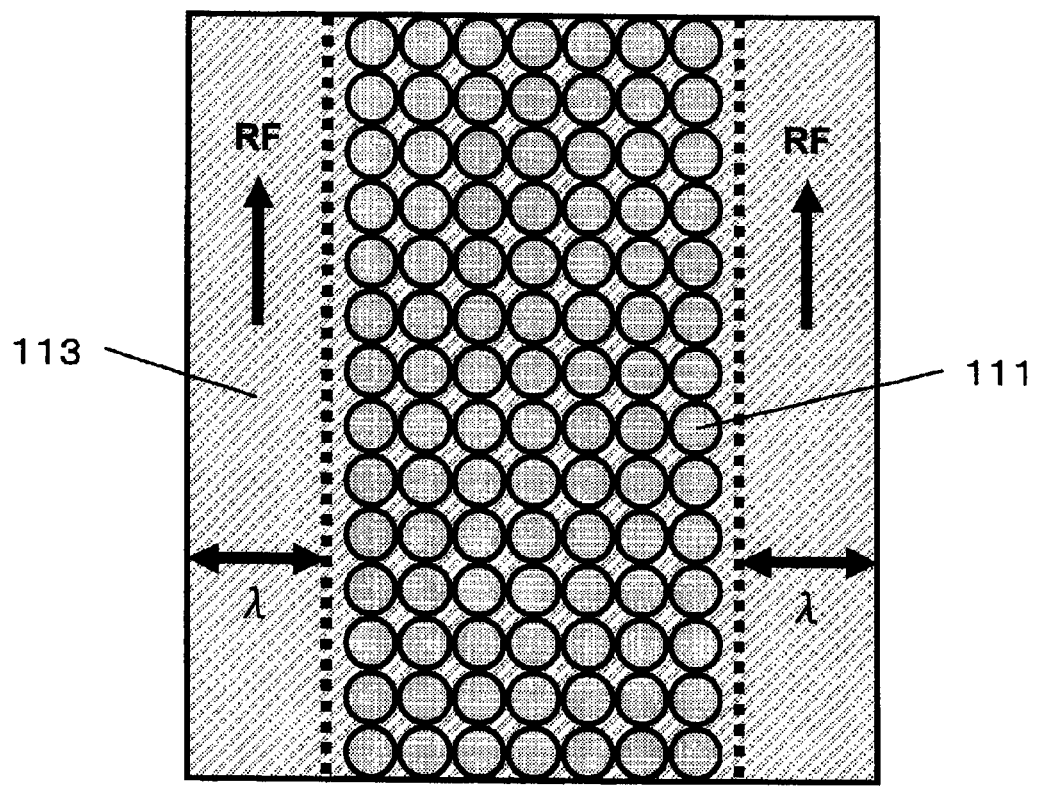
FIG. 7 is a top view to show the configuration of an electromechanical switch in a sixth embodiment of the invention.
Figure 8:
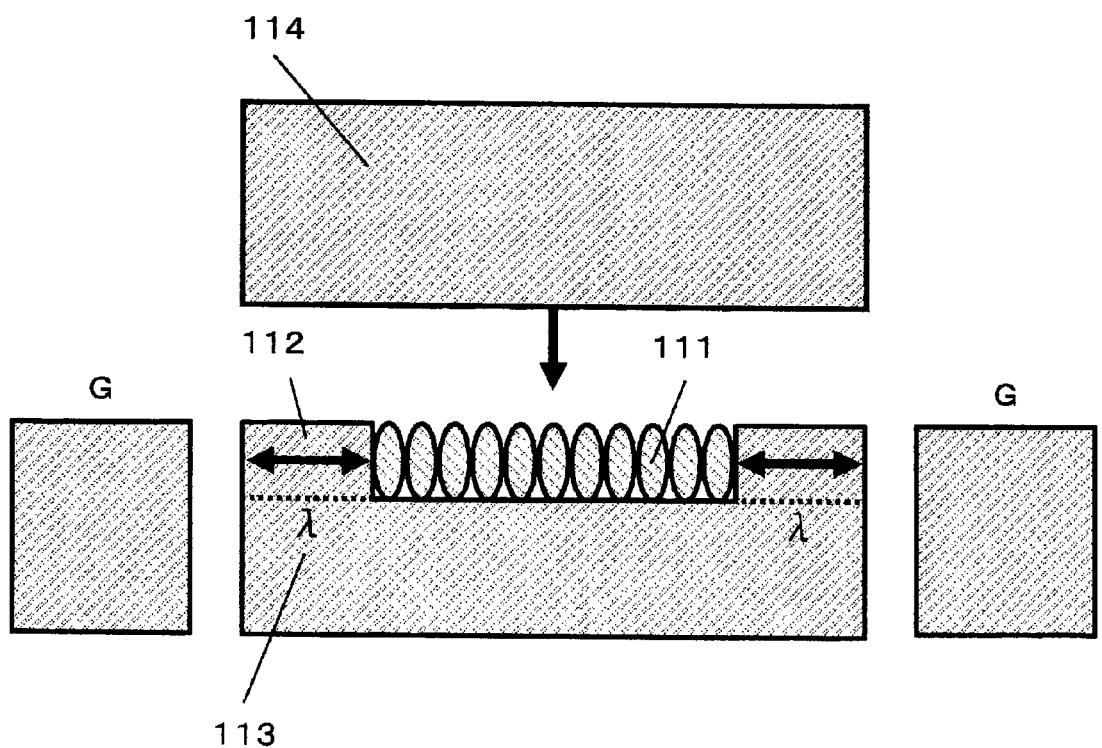
FIG. 8 is a cross-sectional schematic representation to show the configuration of an electromechanical switch using the electromechanical switch in the sixth embodiment of the invention.

FIG. 7 is a top view to show the configuration of a fixed electrode 113 having a hydrophobic surface structure in a sixth embodiment of the invention. FIG. 8 is a cross-sectional schematic representation of an electromechanical switch to show a coplanar waveguide (CPW) using the fixed electrode 113 having a hydrophobic surface structure. As the coplanar waveguide, a signal line having a ground conductor G on both sides of the fixed electrode 113 (moving electrode 114) where a radio frequency signal propagates is a structure often used in an electromechanical switch. In this case, an electric field based on a radio frequency signal is generated from the fixed electrode 113, the moving electrode 114 to the ground conductors on both sides and the radio frequency signal propagates on the surface on the ground conductor side of the fixed electrode 113, the moving electrode 114 as the signal line. This is called skin effect. Specifically, the electric field concentrates on the depth from the surface of the propagation portion of the radio frequency signal (skin depth $\lambda$).

With the structure wherein the monolayer 111 is formed on the full face of the fixed electrode 113 in the related art, there is a possibility that the monolayer 111 may be exposed to the electric field produced by a radio frequency signal and may receive electric damage. In the sixth embodiment, however, in the portion of the skin depth $\lambda$ from both ends of the fixed electrode 113, the fixed electrode 113 has a surface material and the monolayer 111 is formed in other portions, whereby no monolayer is formed in the propagation path of a radio frequency signal and it is made possible to prevent occurrence of a dielectric loss and an increase in an insertion loss caused by the monolayer. The electric field concentration portion is not formed with a monolayer and is made of an electrode material and therefore it is made possible to prevent degradation of the monolayer.

The configuration is adopted, whereby the monolayer 111 can be protected from the electric field produced by a radio frequency signal, occurrence of a dielectric loss and electric damage can be avoided, and a highly reliable hydrophobic electrode structure with a low insertion loss can be realized.

The structure shown in the sixth embodiment can be applied to the first to fifth embodiments and the width of the convex part 112 forming the direct contact area, namely, the first area in the first embodiment can be set to the skin depth $\lambda$ or more from both ends of the fixed electrode 113.

Seventh Embodiment

Next, a seventh embodiment will be discussed.

An electromechanical switch of the embodiment presents a drain structure wherein a projection structure formed on a surface with a monolayer is provided on a fixed electrode for spontaneously moving a droplet positioned on the projection structure to a neighboring hydrophilic portion. It is characterized by the fact that a liquid crosslink is not formed in the contact part between electrodes and thus occurrence of Laplace pressure can be avoided.

Figure 9:
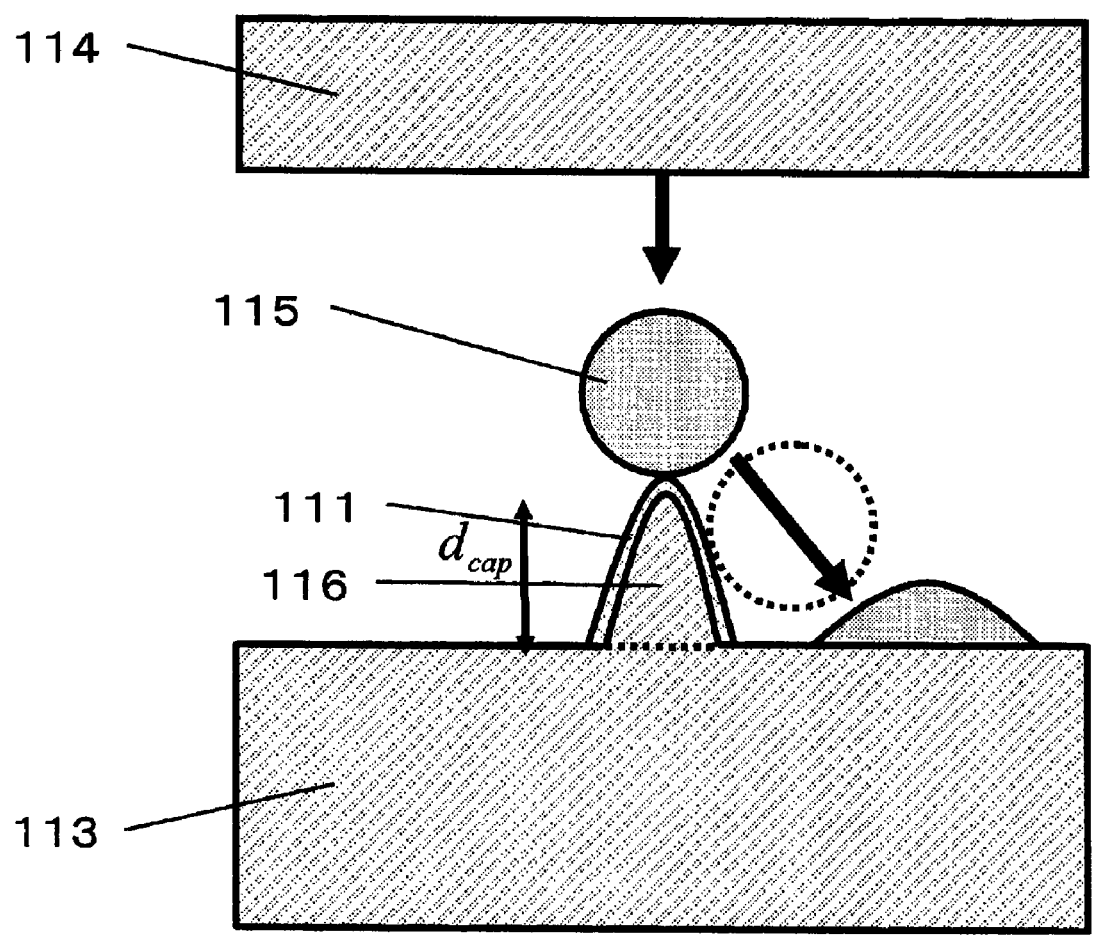
FIG. 9 is a sectional view to show the configuration of an electromechanical switch in a seventh embodiment of the invention.

FIG. 9 is a sectional view to show the configuration of an electromechanical switch of a hydrophobic electrode structure in the seventh embodiment of the invention. A projection structure 116 is formed on a fixed electrode 113 and a monolayer 111 is formed on the surface of the projection structure 116. If a moving electrode 114 comes in contact with the fixed electrode 113, the tip of the projection structure 116 on the surface and the surface of the moving electrode 114 come in direct contact with each other. The Laplace pressure is determined by the behavior of a droplet 115 on the projection structure 116. If a droplet is deposited on the projection structure, the droplet moves from the hydrophobic surface to the neighboring hydrophilic surface where the fixed electrode material is the surface material. This means that the droplet 115 shed on the projection structure 116 moves to the neighboring hydrophilic surface portion with good wettability and is ejected from the top of the projection structure 116 as the contact interface. If the membranaceous of the monolayer 111 is degraded mechanically electrically in the tip of the projection structure 116 as the contact interface, there is a possibility that the hydrophobic nature may be impaired and a meniscus may be formed. In such a case, in the configuration, a droplet does not exist on the contact interface and thus formation of a meniscus can be avoided.

To avoid formation of a meniscus between the surfaces of the fixed electrode 113 and the moving electrode 114 if the droplet 115 is deposited on the neighbor of the projection structure 116, the height of the projection structure 116 needs to be made higher than the interelectrode distance $d_{cap}$ at which a meniscus can exist shown in expression (1).

Eighth Embodiment

Next, an eighth embodiment will be discussed.

Figure 10A:
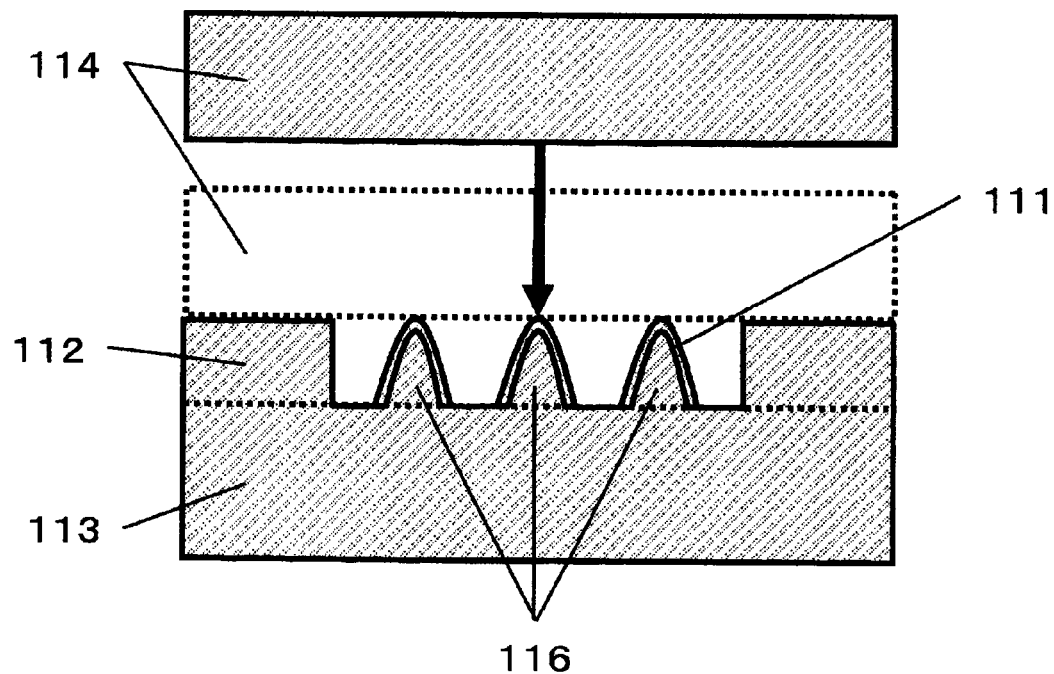
FIG. 10 is a sectional view to show the configuration of an electromechanical switch in an eighth embodiment of the invention; (a) is a sectional view to show the configuration of the electromechanical switch and (b) is a sectional view to show the configuration of the electromechanical switch.
Figure 10B:
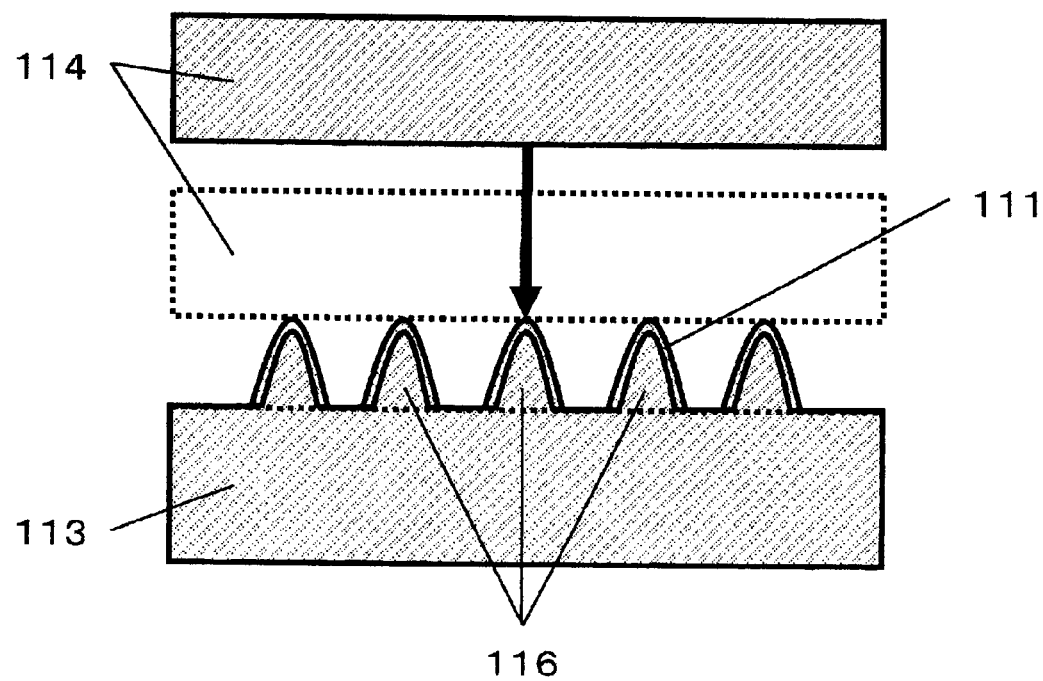

FIG. 10 is a sectional view to show the configuration of an electromechanical switch of a hydrophobic electrode structure in the eighth embodiment of the invention. In FIG. 10 (a), projection structures 116 are formed between convex parts 112 of electrode material formed on the surface of a fixed electrode 113. That is, the embodiment is characterized by the fact that a concave part is formed on the electrode surface as described above in the first to fifth embodiments, whereby the concave part surrounded by the convex parts 112 of electrode material is formed and the projection structures 116 coated on the surfaces with a monolayer are formed in the concave part. The heights of the projection structures 116 are made uniform so that the projection structures 116 become the same height as the convex parts 112, and the contact interface between the fixed electrode 113 and the moving electrode 114 is a composite surface of the convex parts 112 formed of electrode material and the projection structures 116. The monolayer 111 and the projection structures 116 can be protected from physical compression of the moving electrode 113, and a highly reliable hydrophobic surface structure also having drainability of the contact interface can be realized.

The projection structures 116 can also be formed on the full face of the contact interface between the fixed electrode 113 and the moving electrode 114, as shown in FIG. 10 (b).

Ninth Embodiment

Next, a ninth embodiment will be discussed.

Figure 11A:
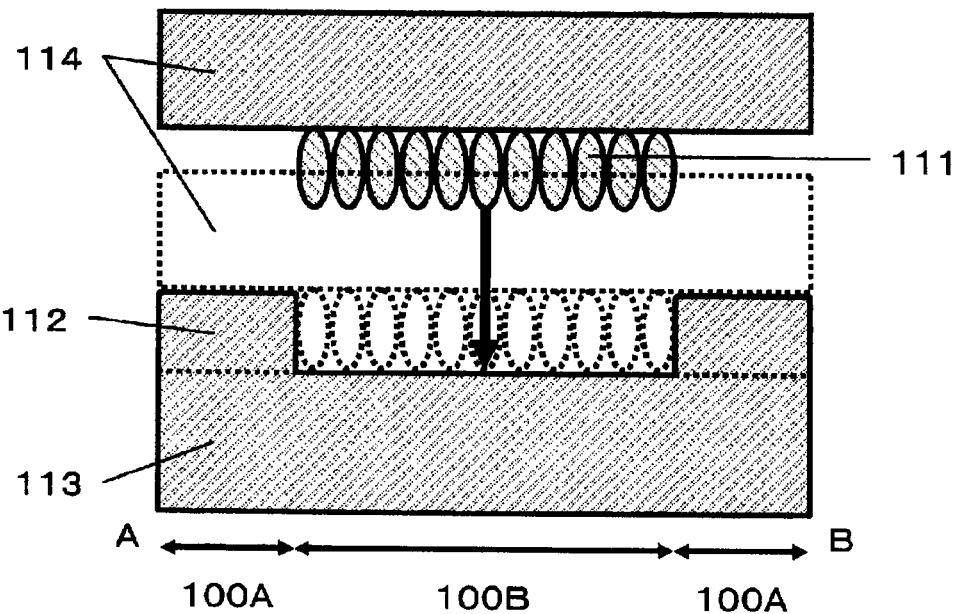
FIG. 11 is a sectional view to show the configuration of an electromechanical switch in a ninth embodiment of the invention; (a) is a sectional view to show the configuration of the electromechanical switch and (b) is a sectional view to show the configuration of the electromechanical switch.
Figure 11B:
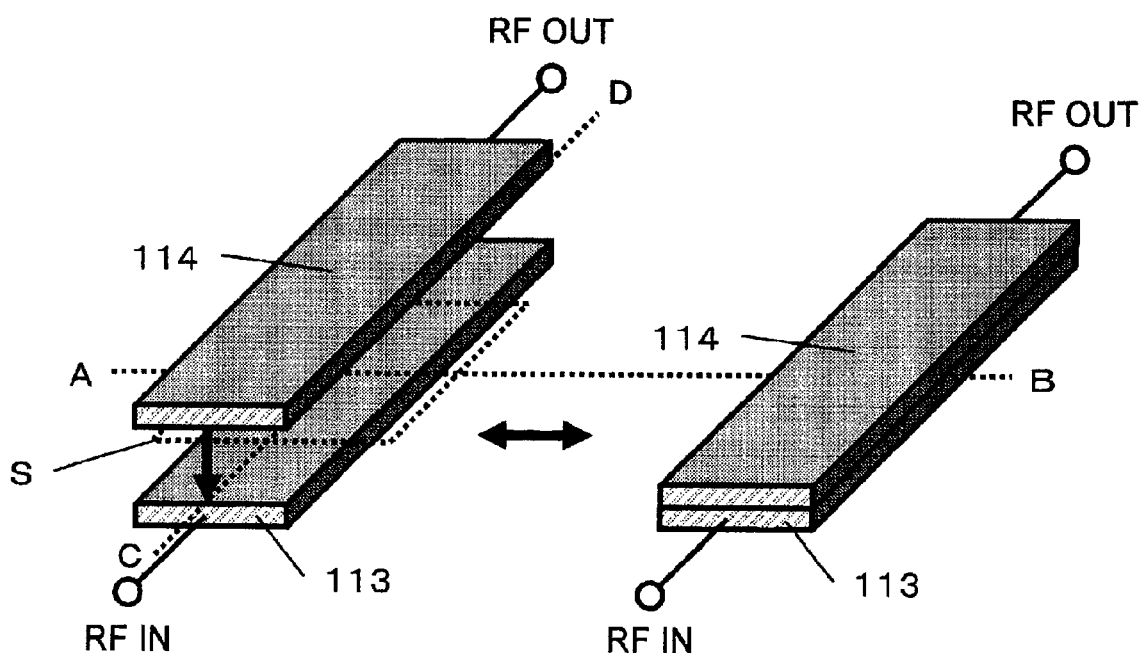

FIG. 11 is a sectional view to show the configuration of an electromechanical switch using a hydrophobic electrode structure in the ninth embodiment of the invention. In FIG. 11 (a), a monolayer 111 is formed on the side of a moving electrode 114 at the position corresponding to a concave part formed between convex parts 112 of electrode material formed on the surface of a fixed electrode 113 and at the contact time of the electromechanical switch, the fixed electrode 113 and the moving electrode 114 come in direct contact with each other in a first area as in the first embodiment and on the other hand, they come in contact with each other in a second area through the monolayer 111 (hydrophobic layer) formed on the moving electrode 114. Others are similar to those of the first embodiment.

FIG. 11 (a) shows the section taken on line A-B in FIG. 11 (b). The fixed electrode 113 is formed on the surface with the convex part 112 formed of the same electrode material as the fixed electrode 113, and the monolayer 111 is formed at the position corresponding to the concave part between the convex parts 112, of the moving electrode 114 on the side opposed to the fixed electrode 113. Thus, at the contact time, the convex part 112 forms a first area 100A for coming in direct contact with the surface of the moving electrode 114 and the concave part forms a second area 100B for coming in contact with the moving electrode through the monolayer 111 as in the first embodiment. Thus, the structure wherein the monolayer 111 is formed in the area of the flat moving electrode 114 corresponding to the concave part of the fixed electrode 113 is adopted, so that if the moving electrode 114 physically comes in contact with the fixed electrode 113, the moving electrode 114 comes in contact with the convex part 112 and does not add physical compression to the monolayer 111 entering the concave part.

Thus, if the moving electrode 114 physically comes in contact with the fixed electrode 113, the moving electrode 114 comes in contact with the convex part 112 formed of the same material as the fixed electrode and does not add physical compression to the monolayer, whereby degradation of the mechanical strength of the monolayer can be prevented and it is made possible to provide a highly reliable hydrophobic electrode structure.

Tenth Embodiment

Next, a tenth embodiment will be discussed.

Figure 12:
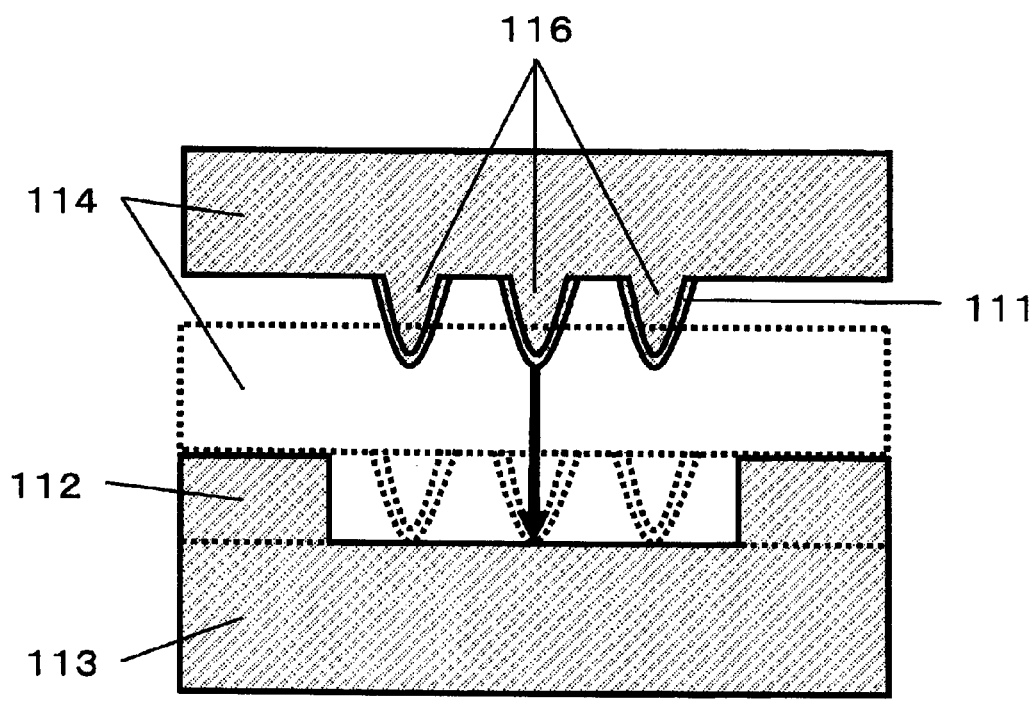
FIG. 12 is a sectional view to show the configuration of an electromechanical switch in a tenth embodiment of the invention; (a) is a sectional view to show the configuration of the electromechanical switch, (b) is a sectional view to show the configuration of the electromechanical switch, and (c) is a sectional view to show the configuration of the electromechanical switch.

FIG. 12 is a sectional view to show the configuration of an electromechanical switch of a hydrophobic electrode structure in the tenth embodiment of the invention. In FIG. 12, projection structures 116 are formed on the surface of a moving electrode 114, in the corresponding area, between convex parts 112 of electrode material formed on the surface of a fixed electrode 113. That is, it is a modified example of the structure shown in the eighth embodiment and is characterized by the fact that a concave part is formed on the electrode surface of the fixed electrode 113 and the concave part surrounded by the convex parts 112 of electrode material is formed and the projection structures 116 coated on the surfaces with a monolayer are formed on the moving electrode corresponding to the concave part. The heights of the projection structures 116 are made uniform so that the projection structures 116 become equal to the convex parts 112 in height, and the contact interface between the fixed electrode 113 and the moving electrode 114 is a composite surface of the convex parts 112 formed of electrode material and the projection structures 116. Also in the configuration, the monolayer 111 and the projection structures 116 can be protected from physical compression of the moving electrode 113, and a highly reliable hydrophobic surface structure also having drainability of the contact interface can be realized.

Eleventh Embodiment

Next, an eleventh embodiment will be discussed.

Figure 13:
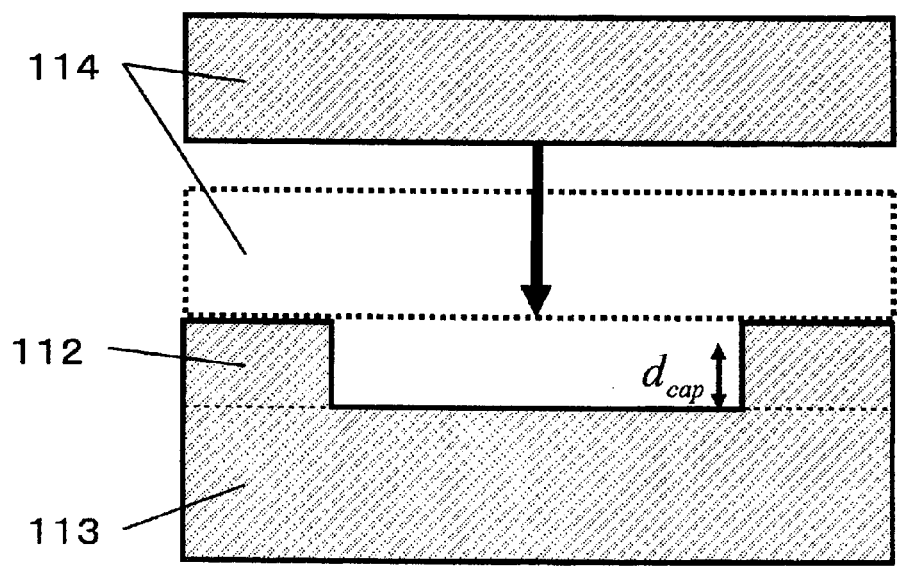
FIG. 13 is a sectional view to show the configuration of an electromechanical switch in an eleventh embodiment of the invention.
Figure 14:
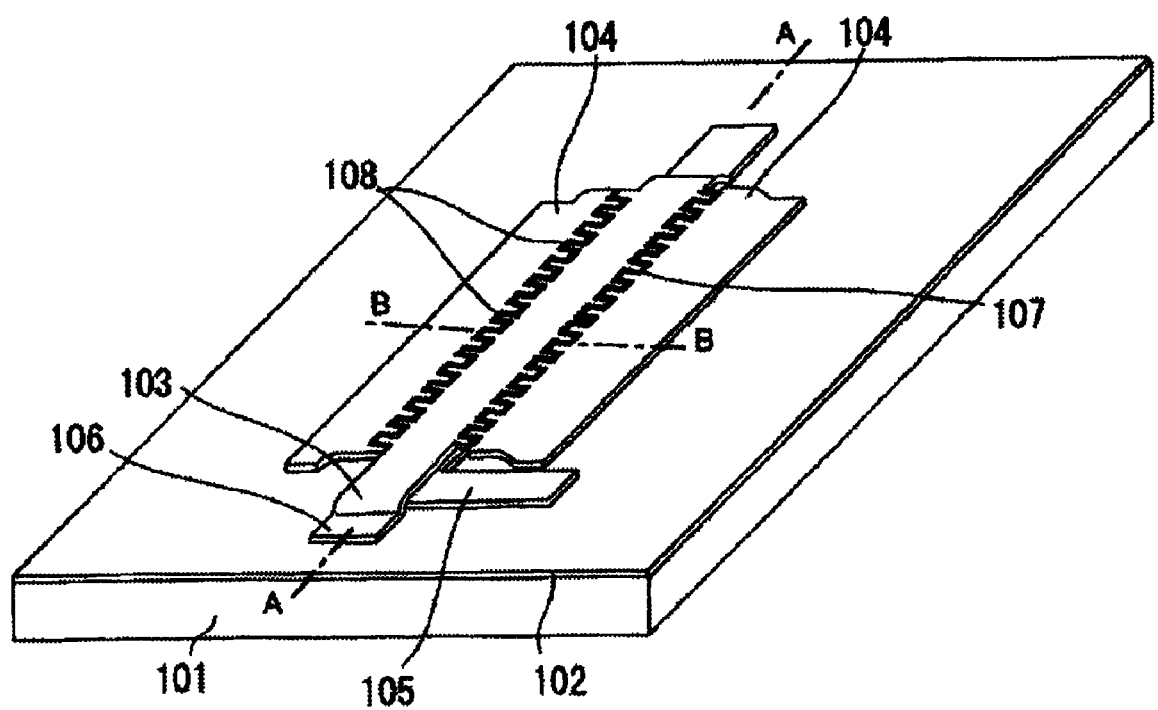
FIG. 14 is a perspective view to show the configuration of a high-speed response and low-voltage driven electromechanical switch.
Figure 15A:
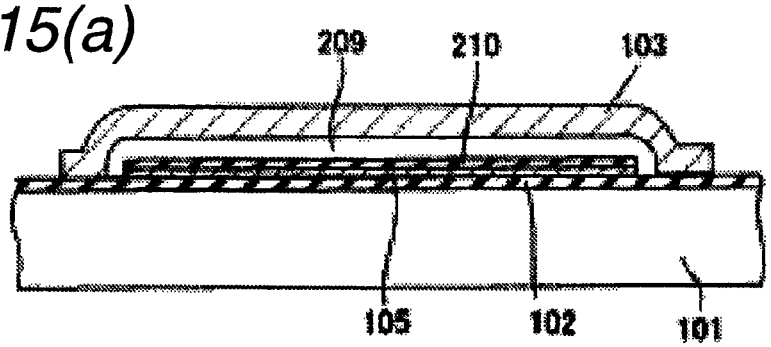
FIG. 15 (*a*) is a sectional view taken on line A-A' in FIG. 14 and FIG. 15 (*b*) is a sectional view taken on line B-B' in FIG. 14.
Figure 15A:
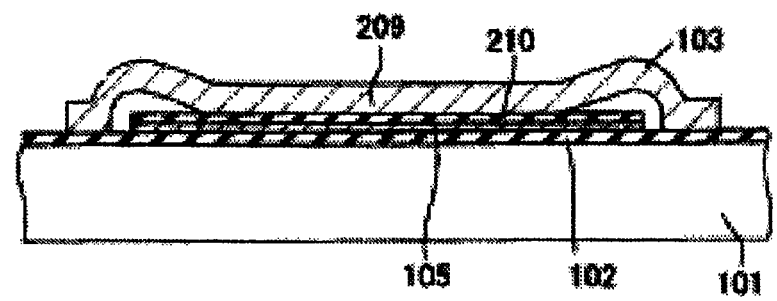
Figure 15B:
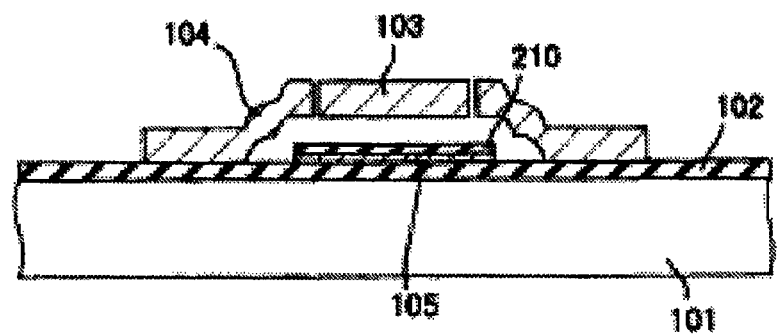
Figure 15B:
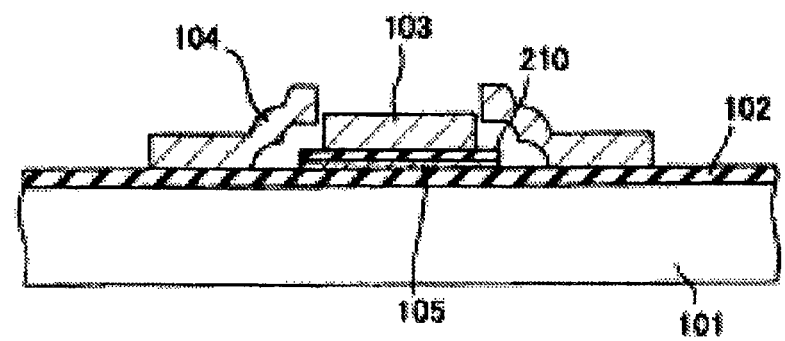
Figure 16A:
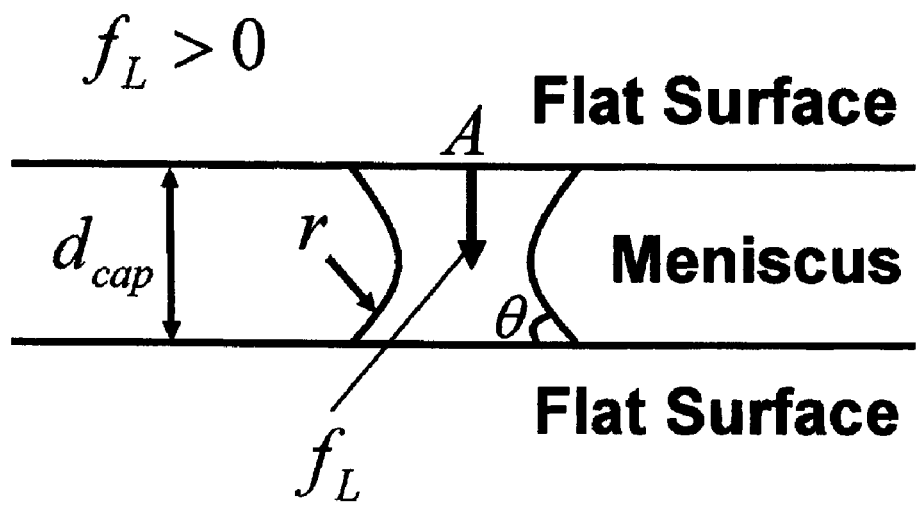
FIG. 16 is a drawing to show the structure of a meniscus; (a) is a sectional view to show the case where the electrode surface is hydrophilic and (b) is a sectional view to show the case where the electrode surface is hydrophobic.
Figure 16B:
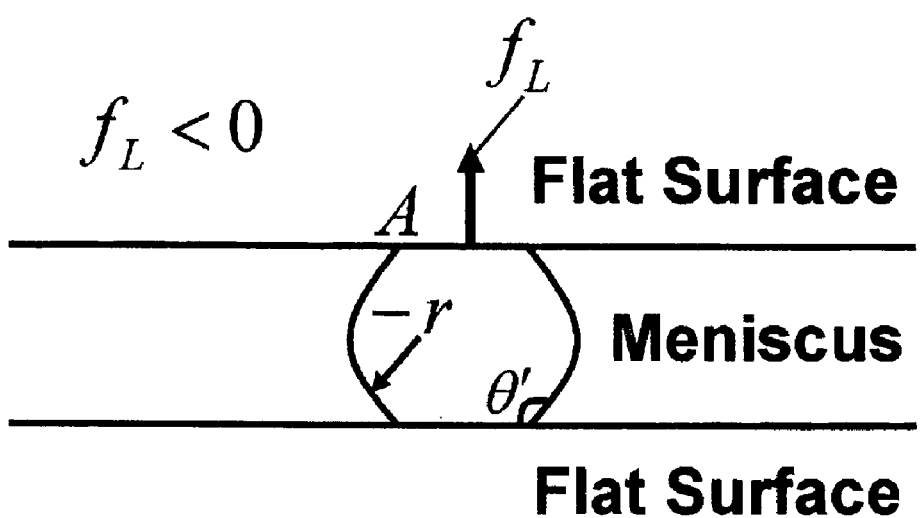
Figure 17A:
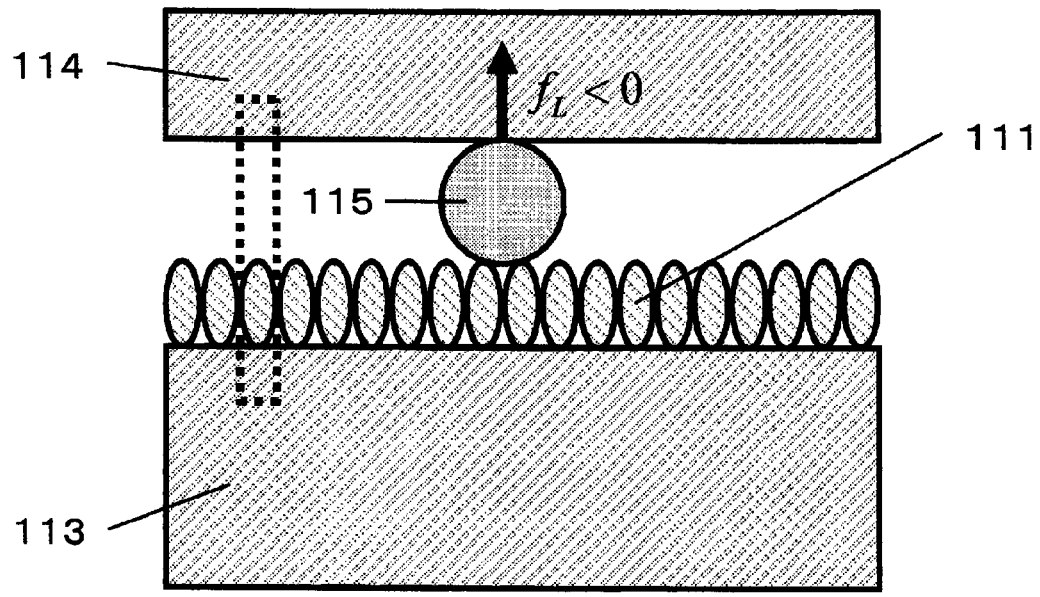
FIG. 17 is a drawing to show the electrode face structure after a monolayer is formed in a related art; (a) is a general view and (b) is a drawing to show the dotted line part in FIG. 17 (*a*).
Figure 17B:
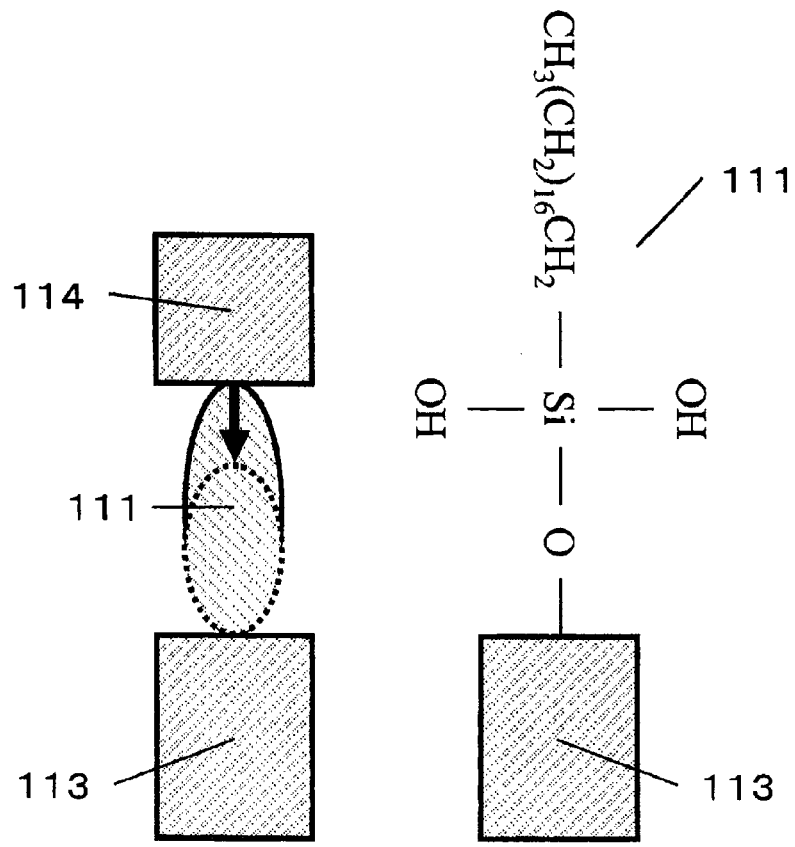

As the eleventh embodiment of the invention, a structure wherein neither projection structures 116 nor a monolayer 111 is formed as shown in FIG. 13 can also be adopted. In this case, the height of a convex part 112 needs to be made higher than the interelectrode distance $d_{cap}$ at which a meniscus can exist. According to the structure, a meniscus is not formed on the exclusive-occupation contact interface other than the convex part 112, so that occurrence of Laplace pressure can be avoided and it is made possible to avoid stiction. At this time, the convex part 112 of a fixed electrode forming a first area 100a is set to about skin depth λ, whereby electric connection can be made only in the first area 100a and mechanical contact can be avoided in a second region 100b so as to prevent breakage.

The structure of the eleventh embodiment can be applied to each of the structures of the first to tenth embodiments described above.

In the embodiments, the contact structure between the fixed electrode and the moving electrode has been described, but the invention can also be applied to other devices of the contact structure between a vibrator and a fixed electrode in a microelectromechanical element, the contact structure in an optical switch, etc., and the like, needless to say.

As described above, in the invention, for example, the surface structure is the composite surface structure of the electrode material and the monolayer having hydrophobicity, whereby physical compression of the monolayer is avoided. The structure wherein the monolayer is not formed on the propagation path of a radio frequency signal is adopted, so that occurrence of a dielectric loss and an increase in an insertion loss caused by the monolayer are prevented. Further, electric field damage is avoided. That is, the invention is characterized by the fact that the surface of the electrode is the composite surface structure having the first area as the contact area of the electrode and the second area where at least a hydrophobic layer intervenes.

In the microelectromechanical element described above, preferably the hydrophobic layer is a coat layer for covering a projection part disposed on the surface of the first member.

According to the configuration, a hydrophobic area is formed in a part of the surface structure, whereby a drain structure for spontaneously moving a droplet from the hydrophobic portion to a neighboring hydrophilic portion can be realized, and it is made possible to prevent a liquid crosslink from being formed on the contact interface. Thus, occurrence of Laplace pressure can be avoided and the droplet can be efficiently ejected to a wetted-property area from the hydrophobic area easily subjected to damage because of contact. Although specific resistance becomes high in the hydrophobic area, the electrically conducting path is formed of a low-resistance hydrophilic area and the hydrophobic area is mainly used for a drain, whereby drainability can be enhanced without increasing the specific resistance. Accordingly, it is made possible to avoid stiction in an MEMS device and it is made possible to realize a highly reliable electromechanical switch. An electrode structure not affected by humidity can be provided and packaging at a high cost (vacuum packaging, etc.) is not required, so that cost reduction of the MEMS device using low-cost packaging is possible.

In the microelectromechanical element described above, preferably the second area is formed so as to coat the projection part of the first member, and the height of the projection part is formed in a length to such an extent that a liquid crosslink can be formed.

In the hydrophobic surface structure described above, preferably the height of the projection structure is determined in response to the use environmental condition.

Height d of the projection part is determined so as to become larger than $d_{cap}$ satisfying the following expression:

[Expression 3]

$$d_{cap}(RH) = -2r_k \cos\theta$$
$$= -\frac{2\gamma_{la} v \cos\theta}{RT\ln(RH)}$$
$$= -\frac{(1.08 \text{ nm})\cos\theta}{\ln(RH)} (if Water)$$

where θ is contact angle, $\gamma_{la}$ is surface energy of liquid and gas interface, v is mole volume, R is gas constant, T is temperature, and RH is relative humidity.

According to the invention, a drain structure for spontaneously moving a droplet positioned on the projection structure from the hydrophobic portion to the neighboring hydrophilic portion can be realized, and a liquid crosslink is not formed in the contact part between the members and thus occurrence of Laplace pressure can be avoided.

In the microelectromechanical element described above, preferably the projection structure is surrounded by the first region.

In the microelectromechanical element described above, a plurality of the projection structures may be formed with a predetermined spacing in a concave part formed in the first area.

In the microelectromechanical element described above, preferably the first member is formed with a concave part corresponding to the formation position of the hydrophobic layer, and the hydrophobic layer is formed on the surface of the second member and comes in contact with the first member in the concave part of the first member.

In the microelectromechanical element described above, preferably the hydrophobic layer is formed on the surface of the second member shaped like a flat plate.

In the microelectromechanical element described above, preferably the hydrophobic layer is formed on the surface of a projection part, of the second member having the projection part corresponding to the concave part.

In the invention, in the microelectromechanical element described above, preferably the first area and the second area are almost equal in height in the first member.

In the invention, in the microelectromechanical element described above, preferably the first area has an area higher than the second area in the first member.

According to the configuration, contact of the second area is avoided, whereby degradation of the mechanical strength can be prevented. For example, the physical contact between the moving electrode and the monolayer is avoided, whereby degradation of the mechanical strength of the monolayer can be prevented and it is made possible to provide the microelectromechanical element including the highly reliable hydrophobic electrode structure.

In the invention, in the microelectromechanical element described above, preferably the second area is formed like an island with a predetermined spacing in the first area.

In the invention, in the microelectromechanical element described above, preferably the second area forms the rectangular island area surrounded by the first area.

According to the configuration, deflection of the moving electrode can be lessened and degradation of the mechanical strength can be prevented by avoiding contact of the second area.

In the invention, in the microelectromechanical element described above, preferably the second area is disposed keeping away from a propagation area of a radio frequency signal.

In the invention, in the microelectromechanical element described above, preferably the first or second member forms wiring of a coplanar structure formed as surrounded by ground wiring on both sides, and the second area is formed as a width corresponding to the skin depth of a radio frequency signal on the electrode is left on both sides.

According to the configuration, electric field concentration can be avoided without largely affecting electric conductivity.

In the invention, in the microelectromechanical element described above, preferably the hydrophobic layer is formed of a monolayer formed on the surface of a first material forming the first area.

In the invention, in the microelectromechanical element described above, preferably the depth of the concave part formed in the first member is equal to the film thickness of one molecular layer of the monolayer.

In the invention, in the microelectromechanical element described above, preferably the members are formed of metal of aluminum, gold, tungsten, etc., an insulator of aluminum oxide, silicon nitride, silicon oxide, $Pb(Zr, Ti)O_3(PZT)$, $(Ba, Sr)TiO_3(BST)$, $SrTiO_3(STO)$, $HfO_2$, AlN, etc., or a semiconductor of silicon, gallium arsenide, etc., and the second area is formed of a monolayer of a silane-based compound.

According to the configuration, the members and the monolayer can be strongly bonded and a highly reliable hydrophobic surface structure can be provided. It can be applied to various elements of a switch, a resonator, a filter, etc., in an optical integrated circuit or a semiconductor integrated circuit, and it is made possible to construct a highly integrated device.

In the invention, preferably an electromechanical switch including a fixed electrode and a moving electrode formed so that it can come in contact with the fixed electrode is formed of the microelectromechanical element described above wherein at least one of the fixed electrode and the moving electrode has a hydrophobic surface structure as described above.

INDUSTRIAL APPLICABILITY

In the electromechanical switch having the hydrophobic surface structure according to the invention, at least one surface structure of the contact interface is the composite surface structure of the first area where the first and second members come in direct contact with each other and the second area where they come in contact with each other through the monolayer, whereby it is made possible to avoid physical compression of the monolayer. The monolayer is formed avoiding the propagation path of a radio frequency signal, so that the monolayer is not formed on the propagation path of a radio frequency signal and it is made possible to prevent occurrence of a dielectric loss and an increase in an insertion loss caused by the monolayer. Also, electric field damage is avoided. According to the configuration, it is made possible to provide the highly reliable hydrophobic surface structure with a low loss maintaining the mechanical and electric durability of the monolayer. It is made possible to avoid stiction in an MEMS device and it is made possible to realize a highly reliable electromechanical switch.

A surface structure not affected by humidity can be provided and packaging at a high cost (vacuum packaging, etc.) is not required, so that cost reduction of the MEMS device using low-cost packaging is possible

The invention claimed is:

1. A microelectromechanical element comprising:
a first member;
a second member that repeatedly comes in contact and noncontact with the first member, and
a hydrophobic layer formed on a surface of the first member,
wherein a contact interface between the first member and the second member includes:
a first area where the first member and the second member directly contact; and
a second area where the first member and the second member contact through the hydrophobic layer,
wherein a concave part is formed between two convex parts of the first member; and
wherein the hydrophobic layer is formed in the concave part.

2. The microelectromechanical element according to claim 1, wherein the hydrophobic layer is a coat layer which covers a projection part provided on the surface of the first member.

3. The microelectromechanical element according to claim 2, wherein the hydrophobic layer is formed so as to coat the projection part of the first member; and
wherein the height of the projection part is formed in a length to an extent that a liquid crosslink can be formed.

4. The microelectromechanical element according to claim 3, wherein height d of the projection part is determined so as to become larger than $d_{cap}$ satisfying the following expression:

[Expression 1]

$$d_{cap}(RH) = -2R_k \cos\theta$$
$$= -\frac{2\gamma_{la} v \cos\theta}{RT\ln(RH)}$$
$$= -\frac{(1.08 \text{ nm})\cos\theta}{\ln(RH)} (ifWater)$$

where θ is contact angle, γla is surface energy of liquid and gas interface, v is mole volume, R is gas constant, T is temperature, and RH is relative humidity.

5. The microelectromechanical element according to claim 2 wherein the projection part is surrounded by the first region.

6. The microelectromechanical element according to claim 2, wherein a plurality of the projection parts are formed with a predetermined spacing in a concave part formed in the first area.

7. The microelectromechanical element according to claim 1, wherein a concave part is formed on the first member so as to correspond to the formation position of the hydrophobic layer; and
wherein the hydrophobic layer is formed on the surface of the second member and comes in contact with the second member in the concave part of the first member.

8. The microelectromechanical element according to claim 7, wherein the hydrophobic layer is formed on the surface of the second member which is shaped in a flat plate.

9. The microelectromechanical element according to claim 7, wherein the hydrophobic layer is formed on the surface of a projection part of the second member having the projection part corresponding to the concave part.

10. The microelectromechanical element according to claim 1, wherein the second area is formed in an island shape with a predetermined spacing in the first area.

11. The microelectromechanical element according to claim 1, wherein the second area forms the rectangular island area surrounded by the first area.

12. The microelectromechanical element according to claim 1, wherein the second area is disposed so as to keep away from a propagation area of a radio frequency signal.

13. The microelectromechanical element according to claim 12, wherein the first member or the second member forms wiring of a coplanar structure formed so as to be surrounded by ground wiring on both sides; and
   wherein the second area is formed so that a width of the second area corresponding to the skin depth of a radio frequency signal on the surface structure is left on both sides.

14. The microelectromechanical element according to claim 1, wherein the hydrophobic layer is formed of a monolayer which is formed on the surface of a first material configuring the first area.

15. The microelectromechanical element according to claim 14, wherein the monolayer is formed of a silane-based compound.

16. The microelectromechanical element according to claim 14, wherein the depth of the concave part formed in the first member is equal to the film thickness of one molecular layer of the monolayer.

17. The microelectromechanical element according to claim 1, wherein the first member and the second member are formed so as to contain any of metal, an insulator, or a semiconductor.

18. The microelectromechanical element according to claim 17, wherein the metal is formed of any of aluminum, gold, or tungsten.

19. The microelectromechanical element according to claim 17, wherein the insulator is formed of any of aluminum oxide, silicon nitride, silicon oxide, $Pb(Zr, Ti)O_3(PZT)$, $(Ba, Sr)TiO_3(BST)$, $SrTiO_3(STO)$, $HfO_2$, or AlN.

20. The microelectromechanical element according to claim 18, wherein the semiconductor is formed of any of silicon or gallium arsenide.

21. An electromechanical switch, comprising:
   a fixed electrode formed on a substrate surface; and
   a moving electrode formed so that the moving electrode can come in contact with the fixed electrode,
   wherein at least a part of an area where the fixed electrode and the moving electrode face each other is formed of the microelectromechanical element according to claim 1.

22. The microelectromechanical element according to claim 1,
   wherein the first area is located on the convex parts.

* * * * *

UNITED STATES PATENT AND TRADEMARK OFFICE
CERTIFICATE OF CORRECTION

| | | |
|---|---|---|
| PATENT NO. | : 8,093,968 B2 | Page 1 of 1 |
| APPLICATION NO. | : 11/814187 | |
| DATED | : January 10, 2012 | |
| INVENTOR(S) | : Yasuyuki Naito | |

It is certified that error appears in the above-identified patent and that said Letters Patent is hereby corrected as shown below:

In column 3, line 60, please delete ","

Signed and Sealed this
Twenty-ninth Day of May, 2012

David J. Kappos
*Director of the United States Patent and Trademark Office*